United States Patent
Brunschwiler et al.

(10) Patent No.: US 9,397,042 B2
(45) Date of Patent: Jul. 19, 2016

(54) INTEGRATED HELICAL MULTI-LAYER INDUCTOR STRUCTURES

(71) Applicant: International Business Machines Corporation, Armonk, NY (US)

(72) Inventors: Thomas J Brunschwiler, Thalwil (SZ); Michele Castriotta, Ronco Briantino (IT); Rachel Gordin, Hadera (IL); Stefano Sergio Oggioni, Milan (IT); Gerd Schlottig, Uitikon Waldegg (SZ)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/160,571

(22) Filed: Jan. 22, 2014

(65) Prior Publication Data
US 2015/0206838 A1 Jul. 23, 2015

(51) Int. Cl.
*H01L 23/522* (2006.01)
*H01L 23/528* (2006.01)

(52) U.S. Cl.
CPC .......... *H01L 23/5227* (2013.01); *H01L 23/528* (2013.01); *H01L 23/5226* (2013.01)

(58) Field of Classification Search
CPC ......... H01L 21/02; H01F 27/06; H01F 27/40; H01F 5/52; H01F 7/60; H01F 27/28; G05F 1/10
USPC .................. 336/105, 195, 200, 220; 323/282; 29/605; 257/E27.018, E21.022; 438/381
See application file for complete search history.

(56) References Cited

U.S. PATENT DOCUMENTS

| | | |
|---|---|---|
| 6,489,875 B1 | 12/2002 | Uchikoba et al. |
| 6,675,462 B1 | 1/2004 | Takahashi |
| 8,110,474 B2 | 2/2012 | Carobolante et al. |
| 2009/0045904 A1* | 2/2009 | Chen et al. ............ 336/200 |
| 2009/0057822 A1 | 3/2009 | Wen et al. |
| 2010/0020509 A1 | 1/2010 | Xie et al. |
| 2011/0109287 A1 | 5/2011 | Nakamura et al. |

OTHER PUBLICATIONS

Mi et al., "Integrated Passives for High-Frequency Applications.", Advanced Microwave Circuits and Systems, 2010.*
Musunuri et al., "Design of Low Power Monolithic DC-DC Buck Converter with Integrated Inductor", IEEE 36th Power Electronics Specialists Conference, 2005, pp. 1773-1779.*

(Continued)

*Primary Examiner* — Selim Ahmed
*Assistant Examiner* — Changhyun Yi
(74) *Attorney, Agent, or Firm* — Ziv Glazberg, Esq.

(57) ABSTRACT

A chip package comprising: a chip stack comprising at least one chip; and a thermal power plane comprising at least two substantially parallel dielectric layers having conductive connectors patterned therein, the at least two dielectric layers electrically connected by vias, wherein said vias are substantially perpendicular to the at least two dielectric layers, wherein each of the vias electrically connects to a connector patterned within a dielectric layer of the at least two dielectric layers at a via connection, wherein an inductor used in supplying power to the at least one chip is formed from the vias and from connectors electrically connecting via connections on each of the at least two dielectric layers.

9 Claims, 4 Drawing Sheets

(56) References Cited

OTHER PUBLICATIONS

Chen et al., "A DC-DC buck converter chip with integrated PWM/PFM hybrid-mode control circuit.", PEDS 2009 International Conference on Power Electronics and Drive Systems 2009, pp. 181-186.

Gardner et al., "Integrated Inductors with Magnetic Materials for On-Chip Power Conversion", Circuits Research Lab & Future Technology Research, Intel Corporation, 2008.

* cited by examiner

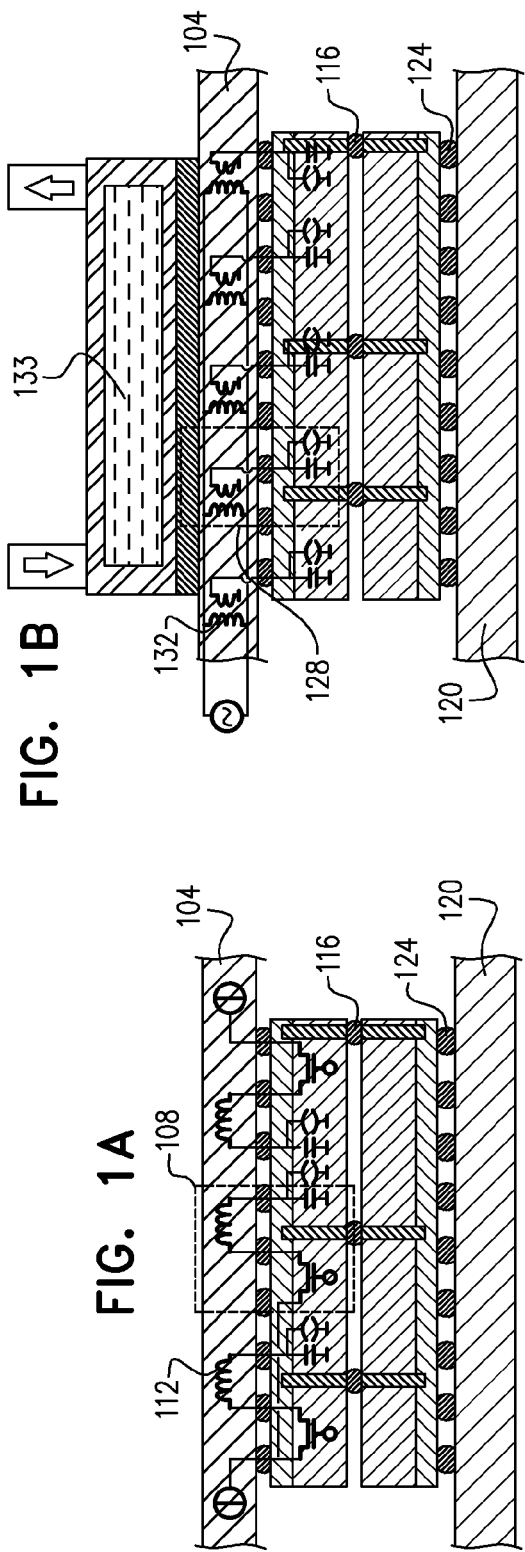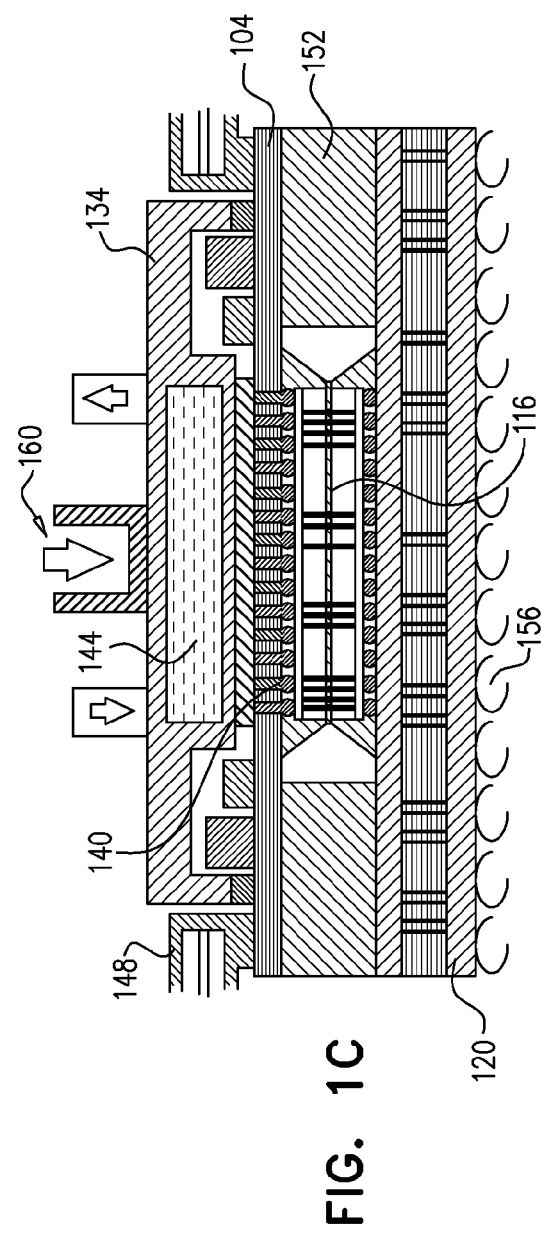

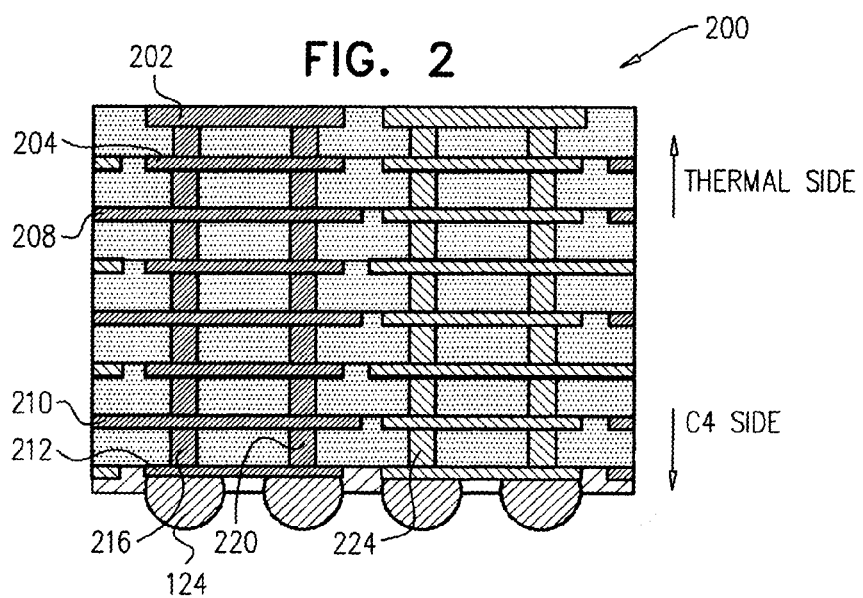
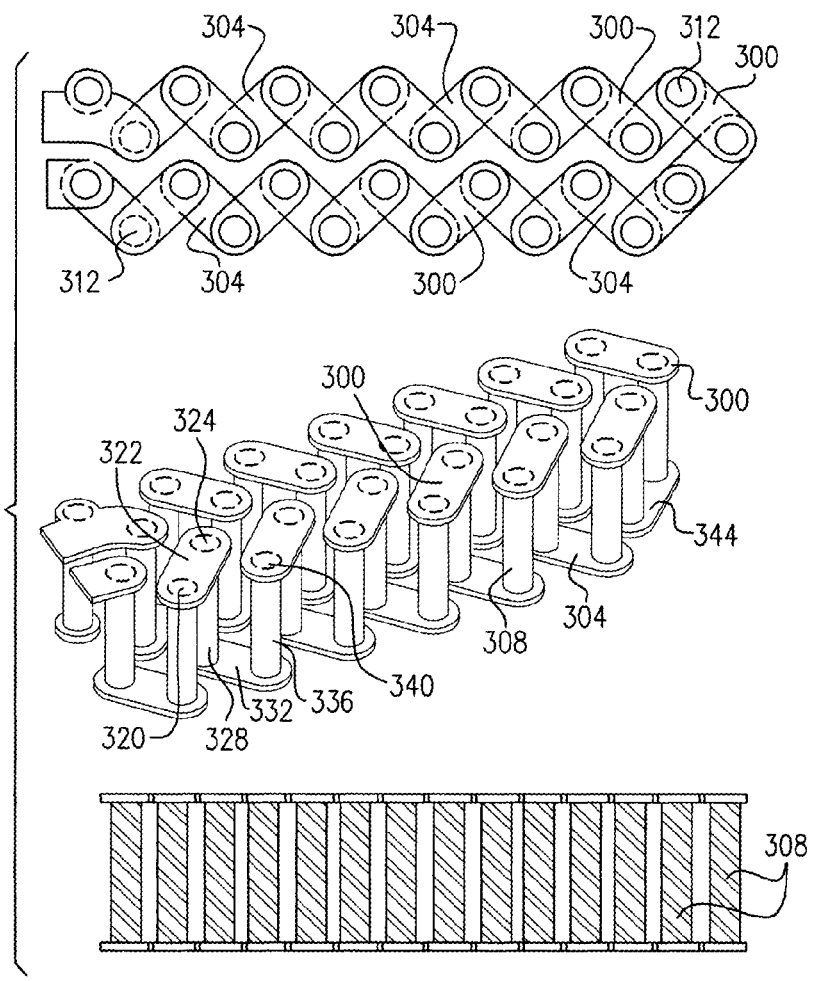

US 9,397,042 B2

INTEGRATED HELICAL MULTI-LAYER INDUCTOR STRUCTURES

TECHNICAL FIELD

The present disclosure relates to power supply on chip, in general, and to a structure for providing per-core adjustment of power supply thus saving on the total power consumed on chip, in particular.

BACKGROUND

In modern chip architectures, and in response to the growing requirements for efficient power consumption, a novel concept of "green power supply on chip" has been introduced.

Each component of a chip, for example each core, may operate in particular frequency and voltage ranges. Generally, the maximal operation frequency of circuits, and specifically CMOS circuits, increases as their supply voltage increases within the working range. On the other hand, their energy consumption is generally proportional to the square of the voltage. Thus, it is required to balance between performance requirements and power supply requirements.

Green power supply may refer in some aspects to per-core adjustment of power supply by dynamic voltage/frequency scaling (DVFS), thus using just enough power to enable each core to perform in accordance with its own requirements, and saving on the total power consumed on chip.

However, providing green power supply for a chip is a complicated problem. Some known methods make use of Buck Converters for regulating the voltage. Buck converters may potentially be highly efficient, and their duty cycle can set an arbitrary voltage conversion ratio. One challenge in building an efficient Buck Converter is the need for a small but highly efficient inductor which is an essential component of the converter. The inductor should have high quality factor (Q) and high inductance (L) density (inductance per area), at frequency range of 100-500 MHz which is the relevant frequency range. Thus, it may be required to reduce the size of the inductors and transformers, which normally occupy a significant fraction, for example about 30%, of the volume of the power converters. It will be appreciated that as the required frequencies are higher, the switching rate of the Buck Converter is required to be faster, and smaller inductors may be used.

BRIEF SUMMARY OF THE INVENTION

One exemplary embodiment of the disclosed subject matter is a chip package comprising: a chip stack comprising one or more chips; and a thermal power plane comprising two or more substantially parallel dielectric layers having conductive connectors patterned therein, the dielectric layers electrically connected by vias, wherein said vias are substantially perpendicular to the dielectric layers, wherein each of the vias electrically connects to a connector patterned within a dielectric layer of the dielectric layers at a via connection, wherein an inductor used in supplying power to the at least one chip is formed from the vias and from connectors electrically connecting via connections in each of the at least two dielectric layers.

THE BRIEF DESCRIPTION OF THE SEVERAL VIEWS OF THE DRAWINGS

The present disclosed subject matter will be understood and appreciated more fully from the following detailed description taken in conjunction with the drawings in which corresponding or like numerals or characters indicate corresponding or like components. Unless indicated otherwise, the drawings provide exemplary embodiments or aspects of the disclosure and do not limit the scope of the disclosure. In the drawings:

FIG. 1A is a schematic illustration of a chip and thermal power plane (TPP) package including an integrated power supply system, in accordance with some exemplary embodiments of the subject matter;

FIG. 1B is a schematic illustration of a second chip and TPP package including an integrated power supply system, in accordance with some exemplary embodiments of the subject matter;

FIG. 1C is a more comprehensive schematic illustration of a chip and TPP package, including an integrated power supply system, in accordance with some exemplary embodiments of the subject matter;

FIG. 2 is a vertical cross section of a TPP layer used for implementing inductors, in accordance with some exemplary embodiments of the subject matter;

FIG. 3A shows a top view, perspective view and side view of a Symmetric U-turn Single Helix Inductor, in accordance with some exemplary embodiments of the disclosed subject matter;

DETAILED DESCRIPTION

Figure 3B:
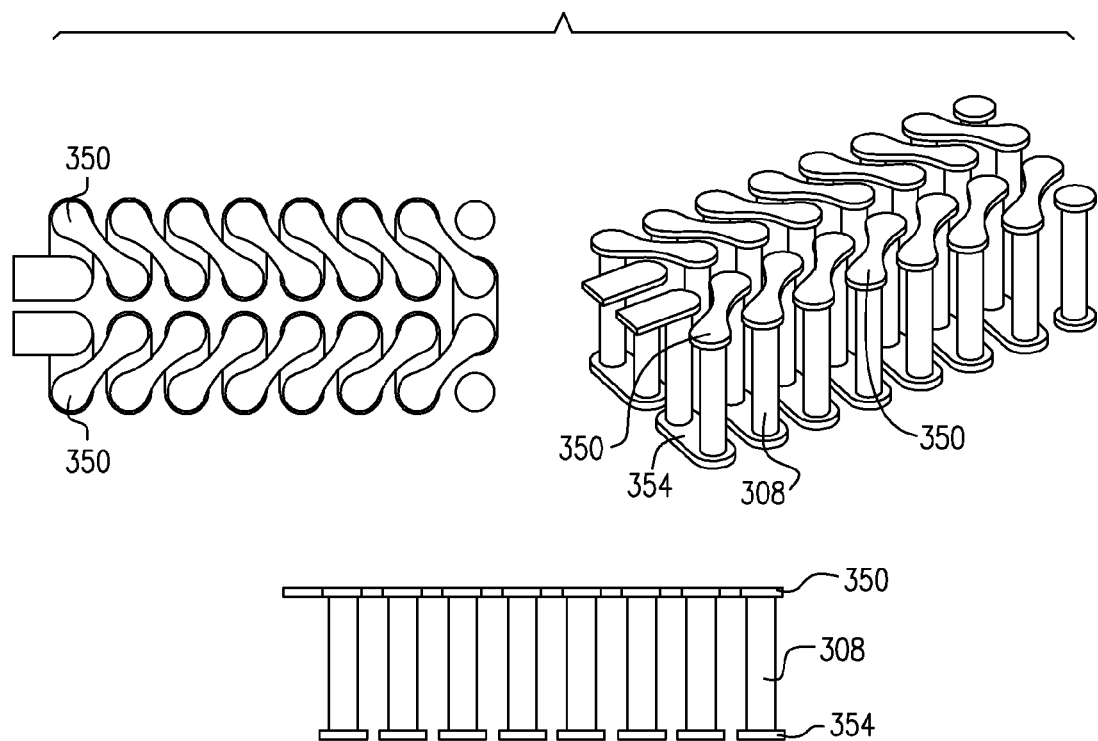
FIG. 3B shows a top view, perspective view and side view of an Asymmetric U-turn Single Helix Inductor, in accordance with some exemplary embodiments of the disclosed subject matter.

One technical problem dealt with by the disclosed subject matter is the need to provide green power supply to chips, e.g., by providing to chip components the required power to enable the components to operate in the required frequency.

Another technical problem dealt with by the disclosed subject matter is the need to provide to per-core power supply, such that each core will receive just the energy required for the frequency it is operating in, and not substantially more than that. Thus, one core requiring more power than another will not cause the other core to consume excessive amounts of energy.

Another technical problem dealt with by the disclosed subject matter is to provide inductors having high quality factor (Q) and high inductance per area (L/A) at a required frequency range, such as 100-500 MHz. Such inductors may be useful in implementing any power supply system, such as but not limited to Buck Converters, which may provide the required energy to cores on a chip.

However, inductors require physical space. If placed on a package externally to the core, an inductor may consume additional space and the essential wiring may also cause energy losses or other problems. Thus, placing the inductors as close as possible to the cores may be beneficial.

One technical solution relates to splitting the components of the power supply circuits, such as Buck Converters, between the Thermal Power Plane (TPP), which is a structure that may be provided above the chip and may be used for heat dissipation, and the chip. The TPP may be structured using dielectric layers having conductive connectors patterned therein, and connected by thick vias for efficient heat dissipation. The areas at which the vias connect to the layers are referred to as via connections. In such partitioning, the inductors may be implemented as part of the TPP, and the switching components such as the transistors may be implemented on the chips.

The term "via" refers to a vertical electrical connection on a chip, a package, or a chip to package, formed by filling vertical holes in the dielectric, or in silicon in case of through silicon vias (TSV) with electrically conducting material. The cross section of the vertical holes may be circular, rectangular, or of any other shape. The conducting material of the via may occupy the whole cross section of the hole, or only a part of it, e.g., as a conducting layer produced by plating the hole walls from inside.

Another technical solution relates to providing novel inductor structures that use the special structure and properties of the laminate layer to obtain high inductance. The structures are generally ribbed helix-shaped or ribbed spiral-shaped and are integrated within the Thermal Power Plane (TPP), and use its layer structure and thermal vias whose primary role is heat removal from the chip. The terms ribbed helix-shaped or ribbed spiral-shaped relate to structures which have the general structure of a helix or spiral, but are piecewise linear or planar, e.g. consist of members or parts wherein each such member or part is a connection along a plane, a cylinder, a substantially linear part, or the like. Wherever a spiral shape or helix shape is referred to, it may also relate to such ribbed structures.

The inductor may be implemented in a general spiral structure in which the loops are formed using electrically conducting connectors patterned within two or more layers of the TPP, and one or more of the thick vias of the TPP structure, used for connecting TPP layers. Since the vias' cross-section characteristic dimensions may be in the order of magnitude of tens of microns, using the vias provides for achieving low resistance.

An inductor may be designed so as to use two or more of the metal layers from which the TPP is constructed, by using micro vias, also referred to as partial vias, which connect any two or more layers, and not necessarily the top and bottom ones.

Yet another technical solution relates to an option to add a magnetic core to the helix-shaped conductor, made for example of NiZn or NiFe as an efficient yoke, or electroplating to increase inductance density.

One technical effect of utilizing the disclosed subject matter relates to inductor structures having high quality factor and yielding high inductance density, which may be used in implementing Buck Converters and enabling green power supply for chips.

Another technical effect of utilizing the disclosed subject matter relates to using the thick laminate structure of the TPP, which may be in the order of magnitude of hundreds of microns, for providing large inductors having high quality factor and high inductance per area, without consuming additional space, and while remaining close to the chip, thus avoiding extra wiring, while the switching components are implemented within the chip. The good dielectric properties of the laminate are efficient in preventing energy loss, and achieving frequency-independent capacitance. The thick vias provide for low resistance of the inductor.

Yet another technical effect of utilizing the disclosed subject matter relates to the usage of the partial vias to provide a wide variety of helix or spiral structures, which are not limited to utilizing two layers but may use multiple layers of the TPP within the same structure.

Yet another technical effect of utilizing the disclosed subject matter relates to designing the inductors with protruding Cu micro-vias as dummy C4s, for efficient heat dissipation, thus enhancing the heat transfer through the laminate inductor.

Referring now to FIG. 1A showing a schematic illustration of the disclosed chip and TPP package, including an integrated power supply system.

The package comprises a TPP 104, which may comprise a multiplicity of layers (not shown), above a chip stack 116 comprising one or more chips. A distributed Buck Converter 108 is implemented such that its inductor 112 is implemented using TPP 104 having high dielectric properties, and the switching components are implemented on chip stack 116. Buck Converter 108 is generally a circuit that switches between two states and serves as an energy source. Higher switching frequency provides for fewer ripples in the output signal. Using such division between TPP 104 and chip stack 116, the inductors utilize the thick laminate of TPP 104, its layer structure and the thick vias going between the layers, to achieve high inductance and high quality factor with low resistance. The inductors, despite their large size, do not take additional space on the chip. The system may also comprise large controlled collapse chip connections (C4) 124, which provide for contact with bottom laminate layer 120.

Referring now to FIG. 1B, showing a schematic illustration of another chip and TPP package with an integrated power supply system.

The package of FIG. 1B also comprises TPP 104 and chip stack 116. The power supply is implemented as one or more integrated transformers 128. The system may also comprise cold plate 133 designed for absorbing heat from TPP 104.

Referring now to FIG. 1C, showing a more detailed illustration of a chip and TPP package implementation into which the integrated power supply system may be integrated.

The package comprises chip stack 116 and TPP 104 made of horizontal layers connected by thick thermal Cu vias 140. In order to implement an integrated inductor to be used in the power supply circuits, the layers and vias may be used for constructing the spiral structures as detailed below.

The system may also comprise sealband 152, laminated bottom 120, thermal pillow 144 and lid integral cold plate 134.

The system may also comprise land grid array 156 and land grid array activation system 160 for providing contacts on the underside of the package.

Input signals, for example 12V and GND, may be received through connection 148.

Referring now to FIG. 2, showing a cross section of a TPP layer in which inductors are implemented as spiral structures using the layers and vias of the TPP.

The TPP, generally referenced 200 comprises a multiplicity of conductive layers 202, 204, 208, 210 and 212, made for example of metal. The layers may be referenced as 1F, 2F . . . (N−1)F, and NF wherein N is the number of layers, 1F is the closest to the thermal side, and NF is closest to the side where the C4s are located.

Each layer may have connectors patterned thereon, according to the implemented spiral structure, as detailed in association with FIGS. 3A, 3B, 3C and 3D below. The thickness of the layers may be in the order of magnitude of tens of microns, for example about 15 to about 18 microns.

The layers may be connected through vias such as vias 216, 220 and 224. The vias may be of substantially round cross section having diameter in the order of magnitude of tens of microns, for example about 60 microns, for ensuring good heat dissipation. Alternatively, the vias may have any cross section.

Each of the vias may connect all layers, 1F through NF, or connect any one or more subsets of the layers, for example 1F-3F and 7F-8F.

Referring now to FIG. 3A, showing a top view, perspective view and side view of a first embodiment of a spiral inductor, referred to as a Symmetric U-turn Single Helix Inductor. The Symmetric U-turn Single Helix Inductor may be designed between any two layers, for example between 1F and NF or any other combination.

In this embodiment, each of connectors 300 connects two via connections on the upper layer, and each of connectors 304 connects two via connections on the lower layer. A via 308 connects one end of a connector 300 on the upper layer with one end of a connector 304 on the lower layer.

Thus, the signal flows through the spiral inductor as follows: from a first via connection 320 on the upper layer to a second via connection 324 on the upper layer through a connector 322, then through via 328 to the via connection on the lower level, and through connector 332 to via 336 and to via connection 340 on the first layer. This route repeats for a predetermined number of times, then makes a U-turn at connector 344 and goes in a corresponding manner to the vicinity of connector 322. It will be appreciated that the holes, connections and vias referred to by the referral numbers in this paragraph are not different from the other corresponding elements in FIG. 3A, and that the referral numbers in this paragraph are intended to provide for easy tracking of the flow direction.

The symmetry referred to in the name is between the upper and the lower layers, which have the same pattern of connectors, only with a possible small displacement.

Referring now to FIG. 3B, showing a top view, perspective view and side view of a second embodiment of a spiral inductor, referred to as an Asymmteric U-turn Single Helix Inductor.

In this embodiment, the connectors on the top layer and on the bottom layer are not connected in the same pattern: rather on one layer, for example the top layer, connectors 350 are in a diagonal direction relatively to the lines connecting the connectors ends, while on the other layer, for example the lower layer, connectors 354 are perpendicular to these lines.

Similarly to the embodiment of FIG. 3A, each connector 350 and each connector 354 connects two via connections, and each via 308 connects an end of connector 350 of the upper layer with an end of connector 354 of the lower layer.

Figure 3C:
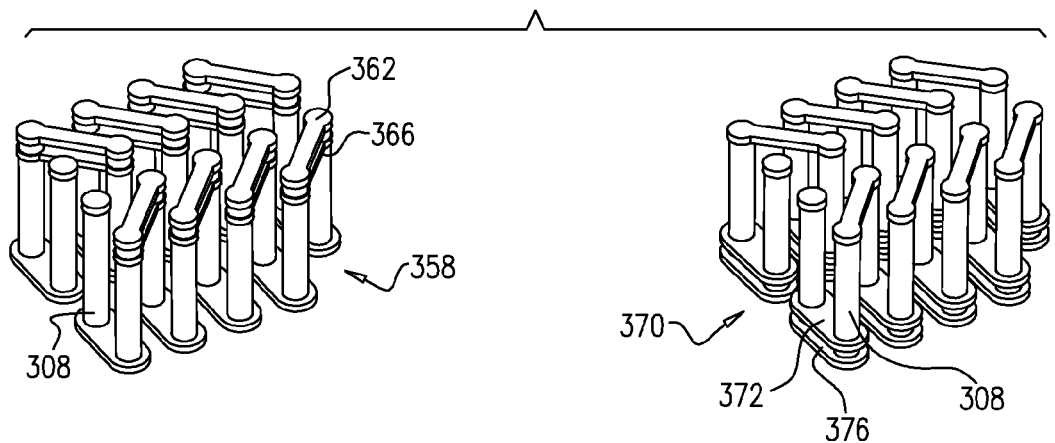
FIG. 3C shows perspective views of two implementations of Multi Plane Link U-turn Asymmteric Single Helix Inductors, in accordance with some exemplary embodiments of the disclosed subject matter.

Referring now to FIG. 3C, showing several views of an embodiment of a third type of spiral inductor, referred to as a Multi Plane Link U-turn Asymmteric Single Helix Inductor.

In this embodiment, similarly to the embodiment of FIG. 3B, connectors on the top layer and on the bottom layer are not connected in the same pattern: on one layer, for example the top layer, the connectors are in a diagonal direction relatively to the lines connecting the connectors ends, while on the other layer, for example the lower layer, the connectors are perpendicular to these lines.

The pattern of FIG. 3C may be multi-layered. Each of the upper layer, the lower layer or both may be implemented as two or more connector sets on two layers of the TPP. For example, in embodiment 358, connectors 362 and 366 are parallel and connect the same vias at different layers, such that the current flowing through the via splits between the two or more connectors. In embodiment 370 connectors 372 and 376 are parallel and connect the same vias on the lower layers.

It will be appreciated that using multiple layers provides for higher flexibility in achieving the required resistance, and desired trade-off between the resistance and volume, which affects the inductance. Although the multi-layer structure yields lower inductance and lower resistance, resulting in substantially the same quality factor as the single helix structure, the multi-layered helix structure allows for higher current.

Figure 3D:
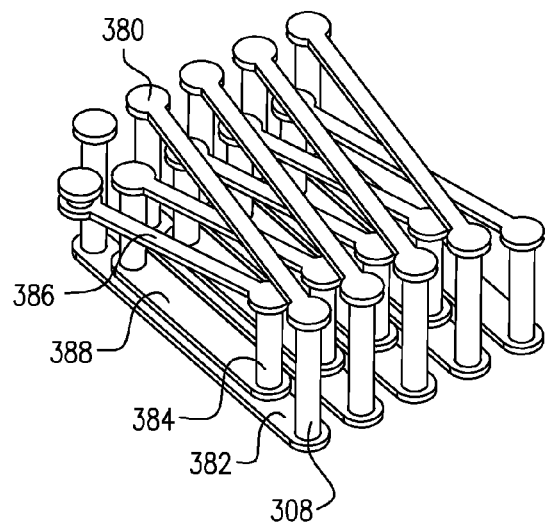
FIG. 3D is a perspective view of a Double Helix Inductor, in accordance with some exemplary embodiments of the disclosed subject matter.

Referring now to FIG. 3D, showing a perspective view of an embodiment of a fourth type of spiral inductor, referred to as a Double Helix Inductor.

This embodiment comprises two assymetrical helixes, one within the other. The first helix comprises vias 308, upper connectors 380 and lower connectors 382. A second helix comprising vias 384, upper connector 386 and lower connectors 388. It will be appreciated that vias 380 can span all layers of the TPP, from 1F to NF, or a partial set. Vias 384, however, have to be partial and use micro vias so that the second helix fits within the first one. Connectors 386 and 388 may or may not be shorter than connectors 382 and 384, respectively, depending on the exact geometry. The current direction of the two helixes is the same, thus approximately doubling the inductance without increasing the required area.

TABLE 1

| Freq (MHz) | L (nH) Single/ double | R (mOhm) Single/ double | Q Single/ double | L density (nH/mm$^2$) Single/ double |
|---|---|---|---|---|
| 100 | 10.7/24.6 | 308/637 | 21.8/24.3 | 14.7/33.7 |
| 500 | 10.5/24.1 | 638/1470 | 51.7/51.5 | 14.4/33.0 |

Table 1 above shows comparative measures of the properties achieved for the single U-turn asymmetric helix structure and the double helix structure of the same area. It will be appreciated by those skilled in the art that these values indicate relatively high quality, with normal inductance density relatively to other known structures such as planar spatial, elongated spatial, stripline, toroidal or Meander structures.

TABLE 2

| Freq. (MHz) | L (nH) Single/ Double/Pla- nar w/film | R(mOhm) Single/ Double/Pla- nar w/film | Q Single/ Double/Pla- nar w/film | L density (nH/mm$^2$) Single/ Double/Pla- nar w/film |
|---|---|---|---|---|
| 100 | 10.7/24.6/2.5 | 308/637/140 | 21.8/24.3/11 | 14.7/33.7/3.5 |

Table 2 above shows comparative measures of the properties achieved for the single asymmetric U-turn helix structure, double helix structure and planar spatial inductor with magnetic film. It will be appreciated by those skilled in the art that these values indicate high quality and better inductance density of both the single helix and the double helix relatively to the planar inductor. Table 1 above also shows no significant degradation of the quality and density when working in frequency of 500 MHz relatively to working in 100 MHz, while such degradation is known to exist for planar spiral inductor with film.

Figure 3E:
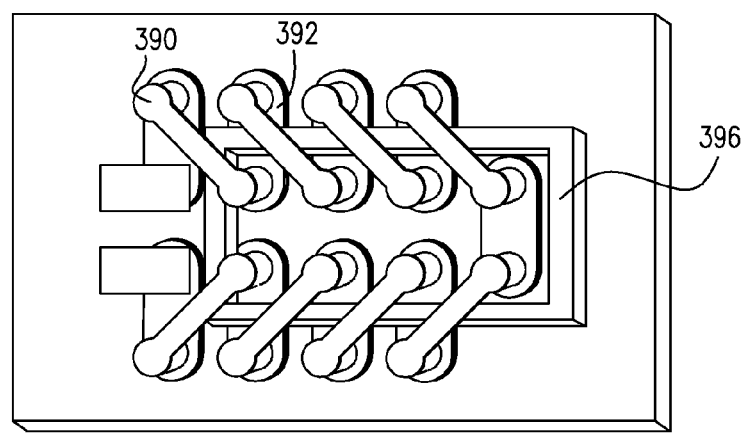
FIG. 3E is a top view of an Asymmetric U-turn Single Helix Inductor with magnetic core, in accordance with some exemplary embodiments of the disclosed subject matter.

Referring now to FIG. 3E, showing a top view of an embodiment of an Asymmetric U-Turn Single Helix Inductor with magnetic core. FIG. 3E shows an asymmetric single helix, similar to the one shown in FIG. 3B above, with an additional magnetic core 390 placed between upper level connectors 390 and lower level connectors 392.

The spiral with the magnetic core yields the highest inductance density of all considered structures. In some embodiments, relative improvement due to the addition of magnetic core is about 1.6 times in quality and about 5.5 times in inductance density. However, the magnetic core may cause energy losses, which depend on the actual core material used, the exact sizes, and other parameters.

TABLE 3

| Freq (MHz) | L (nH) No core/ Core Mu = 250 | R(mOhm) No core/ Core Mu = 250 | Q No core/ Core Mu = 250 | L density (nH/mm$^2$) No core/ Core Mu = 250 |
|---|---|---|---|---|
| 100 | 3.1/16.8 | 200/660 | 9.6/16.0 | 8.5/46 |
| 500 | 2.9/16.8 | 480/1700 | 19.1/31 | 8.0/46 |

Table 3 above shows comparative measures of the properties achieved for the single helix with magnetic core vs. the properties of on-chip inductor structures with magnetic films. Table 3 shows significant improvement in both quality and inductance density.

It will be appreciated that the embodiments presented in FIGS. 3A, 3B, 3C, 3D and 3E are exemplary only and that many combinations or multiple other geometries may be used. For example, any symmetric or asymmetric pattern may be combined with multi-plane links at any required planes, any two or more patterns may be combined into a double- or multi-helix structure, or the like, any such inductor may be implemented with or without a magnetic core, any indictor may be implemented using two, three or more layers, and the layer usage may vary for different parts of the inductor, or the like.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A chip package comprising:
   a chip stack comprising at least one chip, the at least one chip comprising at least one switching component; and
   a thermal power plane comprising at least two substantially parallel dielectric layers patterned within substrate and having conductive connectors patterned therein, the at least two dielectric layers electrically connected by vias, wherein said vias are substantially perpendicular to the at least two dielectric layers,
   wherein one or more vias are stacked to reach from a top of the substrate to a bottom of the substrate and adapted for dissipating heat,
   wherein each of the vias electrically connects to a connector patterned within a dielectric layer of the at least two dielectric layers at a via connection, and
   wherein an inductor used in supplying power to the at least one chip is formed from the vias and from connectors electrically connecting via connections on each of the at least two dielectric layers.

2. The chip package of claim 1, wherein the inductor is formed as a ribbed helix structure or a ribbed spiral structure comprising a plurality of substantially linear members, wherein the linear members comprise at least one connection connecting via connections on one of the at least two dielectric layers and at least one via or part thereof.

3. The chip package of claim 2, wherein the ribbed helix structure or a ribbed spiral structure is a symmetric U-turn single helix structure in which connector patterns on the at least two dielectric layers are substantially identical.

4. The chip package of claim 2, wherein the ribbed helix structure or a ribbed spiral structure is an asymmetric U-turn single helix structure in which connector patterns on the at least two dielectric layers are different.

5. The chip package of claim 2, wherein the ribbed helix structure or a ribbed spiral structure is a multi-plane U-turn asymmetric single helix in which connector patterns formed on two dielectric layers are substantially identical, and different from a pattern formed on a third dielectric layer.

6. The chip package of claim 2, wherein the ribbed helix structure or a ribbed spiral structure is a double helix structure comprising two helixes one of which is internal to the other.

7. The chip package of claim 2, wherein the ribbed helix structure or a ribbed spiral structure is at least partially surrounded by a magnetic core.

8. The chip package of claim 1, wherein the inductor is used in implementing a Buck Converter.

9. The chip package of claim 1, wherein the chip stack comprises a switching component for switching the inductor.

* * * * *